United States Patent [19]

Hiraoka

[11] 4,119,688
[45] Oct. 10, 1978

[54] ELECTRO-LITHOGRAPHY METHOD
[75] Inventor: Hiroyuki Hiraoka, Los Gatos, Calif.
[73] Assignee: International Business Machines Corporation, Armonk, N.Y.
[21] Appl. No.: 807,601
[22] Filed: Jun. 17, 1977

Related U.S. Application Data

[63] Continuation-in-part of Ser. No. 628,266, Nov. 3, 1975, abandoned.

[51] Int. Cl.$^2$ ............................................. H01J 37/31
[52] U.S. Cl. .......................................... 264/22; 29/625; 156/345; 204/155; 204/165; 250/531; 264/101; 427/35
[58] Field of Search .................... 264/22, 25, 26, 101, 264/DIG. 45; 156/16, 345; 250/531; 204/165, 155; 427/35, 18; 29/625

[56] References Cited

U.S. PATENT DOCUMENTS

| 3,453,723 | 7/1969 | Cecil | 29/625 |
| 3,668,028 | 6/1972 | Short | 156/345 |
| 3,679,497 | 7/1972 | Handy et al. | 427/43 |
| 3,681,103 | 8/1972 | Brown | 427/43 |
| 3,873,371 | 3/1975 | Wolf | 427/35 |
| 3,931,435 | 1/1976 | Gipstein et al. | 427/43 |
| 3,956,052 | 5/1976 | Koste et al. | 427/43 |

OTHER PUBLICATIONS

"High-Resolution Positive Resists for Electron-Beam Exposure," IBM Journal-May, 1968, pp. 251-256, Haller et al.
Electron Imaging System for Fabrication of Integrated Circuits, Solid State Electronics, vol. 12, 1969, O'Keeffe et al. pp. 841-848.

Primary Examiner—Jeffery R. Thurlow
Attorney, Agent, or Firm—Joseph E. Kieninger

[57] ABSTRACT

An electro-lithography method suitable for forming a high resolution pattern in an electron sensitive resist material is disclosed. This technology permits the inexpensive high resolution reproduction of masks for use in integrated circuits and magnetic bubbles. The method involves the application of a pulsed, electric field to two parallel electrodes having an electron beam resist layer positioned on one of the electrodes and a mask positioned between the second electrode and the resist layer. The mask forms a gap having a thickness of $10^{-4}$m to $10^{-5}$m with the resist layer.

8 Claims, 2 Drawing Figures 4,119,688

ELECTRO-LITHOGRAPHY METHOD

CROSS-REFERENCE TO RELATED APPLICATIONS

The present application is a continuation-in-part of copending application Ser. No. 628,266 filed Nov. 3, 1975 now abandoned.

FIELD OF THE INVENTION

This invention relates to forming mask patterns and more particularly to a method and apparatus for forming masks patterns in electron sensitive resist material.

BRIEF DESCRIPTION OF THE PRIOR ART

X-ray lithography and electron beam lithography have been used to duplicate mask containing lines in the micron and sub-micron region for use in the manufacture of integrated circuits and for bubble domain devices. X-ray lithography has several disadvantages including time consuming, low sensitivity of resist, and potential damage to the substrate caused by long exposure times and so forth. Electron beam technology has the disadvantage of being slow, requiring a high energy, presence of secondary electrons, and so forth. Electron beam lithography focuses a beam on one point at a time.

An experimental approach was recorded in the article entitled "An Electron Imaging System for the Fabrication of Integrated Circuits" by O'Keeffe et al. in Solid State Electronics, 1969, Vol. 12, pp. 841-848. This article describes an ultra-high resolution electron image projection tube as a means for fabricating large arrays of micron-size transistors in which the electrons are derived from an air stable photocathode. While this system yielded results that were better than other light optic fabrication systems, it has the disadvantages inherent with systems employing light. For example, such systems involving photoelectrons having a low efficiency for electron productions, only a few photoelectric materials such as CsI, paladium and the like will work as well as requiring that the photo-electron emitting cathode be a thin film. This type of system requires a gap having a thickness of $10^{-2}$m between the cathode and the anode.

SUMMARY OF THE INVENTION

It is an object of this invention to provide an improved method of reproducing mask patterns in lithographic resist films.

It is another object of this invention to provide an apparatus for reproducing mask patterns in lithographic resist films.

It is yet another object of this invention to provide a method having a high efficiency in electron production.

It is another object of this invention to produce masks inexpensively and with high resolution.

These and other objects are accomplished by an electro-lithography method and apparatus. The method includes applying a pulsed inhomogeneous electric field to a pair of separated parallel electrodes having a layer of electron sensitive resist material positioned therebetween. A mask positioned between the electrodes and separated from the resist layer by a gap having a thickness of $10^{-4}$m to $10^{-5}$m causes the inhomogeneity of the electric field which forms a high resolution pattern on the resist material. Preferably, the strength of the electric field that is applied is at least 2 KV.

Other object of this invention will be apparent from the following detailed description. Reference being made to the accompanying drawings wherein preferred embodiments of the apparatus is clearly shown.

DESCRIPTION OF THE ILLUSTRATIVE EMBODIMENT

In this invention an electro-lithography method and apparatus are described in which a pulsed, inhomogeneous field is applied across the pair of parallel electrodes to form a pattern in a layer of electron sensitive resist material positioned therebetween. This method is inexpensive and at the same time permits a high degree of resolution of lines in the micron and submicron region. Another advantage is the freedom of back scattering of electrons. This method and apparatus can be used to duplicate the patterns or mask primarily for use in the microcircuitry of integrated circuits.

Figure 1:
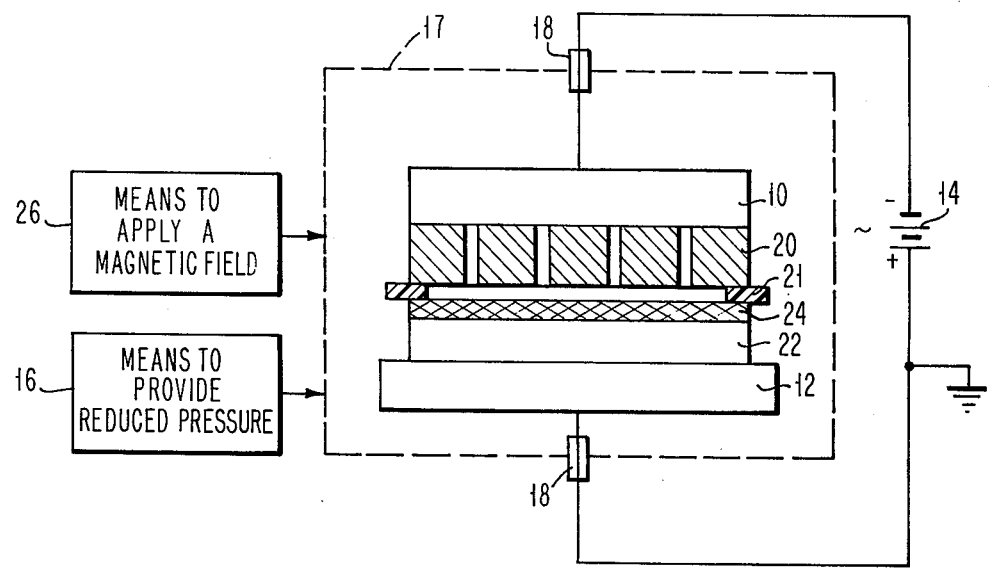
FIG. 1 is a view partly in a cross section of one embodiment of this invention having a mask positioned on the cathode.

As shown in FIG. 1 a cathode 10 and an anode 12 are connected to a power source 14. The cathode 10 and the electrode 12 are, preferably, in the form of flat plates which are parallel to each other. The cathode 10 and the anode 12 may be a metal or a semiconductor such as silicon or germanium. Preferred cathode 10 metals are those having a low work function such as platinum, iridium, paladium, nickel, silver and gold. Other metals such as tungsten, aluminum, copper and the like may also be used. Oxides, for example, barium oxide, strontium oxide, calcium oxide, thorium oxide and/or mixtures thereof, may also be used. Borides, for example, barium boride, calcium boride, cesium boride, lanthanum boride, niobium boride, strontium boride and tantalum boride, may also be used. Carbides, for example, tantalum carbide, strontium carbide and titanium carbide as well as sulphides, for example, barium sulphide and throium sulphide, may also be used.

The cathode 10 and the anode 12 are in spaced relationship with each other in an atmosphere of reduced pressure. Means 16 to provide the reduced pressure may be any conventional device such as a vacuum pump or a diffusion pump. Pressures in the range of $10^{-3}$ to $10^{-5}$ Torr are preferred. Pressures of the order of $10^{-2}$ Torr provide a plasma in which positive ions predominate instead of electrons and hence is unsuitable because the positive ions attack and degrade the mask. Lower pressures can also be used that is, of the order of $10^{-6}$ and $10^{-7}$ Torr; however, these pressures are less satisfactory. The power source 14 is either an AC or DC voltage which is periodically pulsed at a voltage of at least 2 kilovolt and preferably several kilovolts. The means 16 provides a reduced pressure in the area 17 surrounding the electrodes 10 and 12. Electrical feed-through 18 permits the power source 14 to be outside of the vacuum area 17.

Positioned on the cathode 10 is a mask 20. The mask 20 is of a material which should be an insulator, for example, silica, alumina, Mylar film and the like and has a thickness of the order of $10^{-5}$m to $10^{-6}$m. The anode 12 serves as a support for the substrate 22. The substrate 22 may be a silicon, germanium or garnet wafer. The use of both the anode 12 and the substrate 22 is optional, since the substrate 22 may serve as the anode 12. Positioned on top of the substrate 22 is a resist layer 24. The resist layer 24 may be a negative or positive E-beam resist, preferably a positive one such as a polymethylmethacrylate, as copolymers, polymeric ketones, poly (olefin sulfones) or the like. A spacer 21 of a dielectric material, for example Mylar, is positioned between the mask 20 and the E-beam resist layer 24 to form a gap. The thickness of this gap is critical and is $10^{-4}$m to $10^{-5}$m. The following data illustrate the resolution obtained with different gap thicknesses between the mask and the resist layer.

| Gap Thickness M | Mask | Resolution m |
|---|---|---|
| $6 \times 10^{-3}$ | Pyrex | None |
| $10^{-4}$ | Pyrex | $\sim 50 \times 10^{-6}$ |
| $5 \times 10^{-5}$ | Pyrex | $\sim 10 \times 10^{-6}$ |
| $2 \times 10^{-5}$ | Pyrex | $\sim 3 \times 10^{-6}$ |
| $2 \times 10^{-5}$ | Mylar | $\sim 5 \times 10^{-6}$ |
| $\sim <10^{-5}$ | Pyrex | $\sim 3 \times 10^{-6}$ |

No image developed due to complete electron spread when the gap thickness was $6 \times 10^{-3}$m. When the gap is $10^{-5}$ or smaller electrical breakdown due to shorting becomes significant. As a result, the preferred thickness of the gap is $5 \times 10^{-5}$m to $2 \times 10^{-5}$m. Means 26 to apply a magnetic field is positioned near the electrodes 10 and 12 as desired.

When the power source 14 is activated, a vertical electric field is pulsed between the cathode 10 and the anode 12. Electrons escaping from the surface of the cathode 10 not covered by the mask 20 hit the surface of the resist layer 24 with a high energy, for example, 10 KV, thereby degrading the resist to form a pattern similar to the mask 20. The mask 20 collimates the electrons passing therethrough to provide high resolution. Further treatments of the resist layer 24 such as developing, metal deposit, and stripping of the resist film are the same as in conventional electron beam technology that is described in the IBM Journal of Research and Development, Vol. 12, p. 251 (1968), which is incorporated herein by reference thereto.

The magnetic field 26 is used in order to maximize the resolution of lines in the micron and submicron region. Resolution of the order of 3 microns ($3 \times 10^{-6}$m) is readily obtainable in the absence of the magnetic field 26. With the use of a magnetic field 26 applied perpendicular to the plane of the gap, higher resolution of the order of $10^{-7}$m can be obtained.

Figure 2:
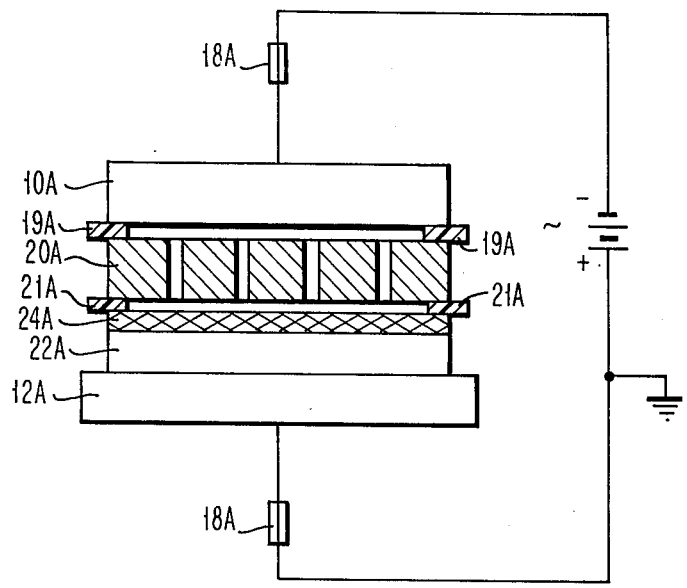
FIG. 2 is a view partly in cross section of an embodiment of this invention having a proximity mask positioned above the layer of resist material.

FIG. 2 is similar to FIG. 1 and as a result for reasons of simplicity some of the elements are not repeated in FIG. 2 although it is understood that they would be incorporated in the apparatus and in the method using the apparatus described in FIG. 2. Only those elements which are arranged between the cathode 10A and the anode 12A are identified in FIG. 2. As shown in FIG. 2 the anode 12A supports the substrate 22A. The substrate 22A supports a layer of E-beam resist 24A. A self-sustaining mask 20A is positioned on top of a spacer 21A which rests on the resist layer 24A. The self-sustaining mask 20A may have a thickness preferably in the range $10^{-5}$m to $10^{-6}$m. The mask 20A is separated from the resist layer 24A by a gap which has a critical thickness of $10^{-4}$m to $10^{-5}$m as described in FIG. 1. The mask layer 20A is separated from the cathode 10A by a spacer 19A. The thickness of the spacer 19A is preferably about $10^{-3}$m to $10^{-4}$m. The method employing the apparatus shown in FIG. 2 is referred to as the proximity mask mode since the mask is positioned on top of the resist layer, being separated therefrom by a spacer. The method employing the apparatus shown in FIG. 1 is referred to as the emitter mask mode because the mask is positioned on the emitter or cathode.

EXAMPLE 1

Using the emitter mask mode shown in FIG. 1 an electron beam resist film of polymethylmethacrylate having a thickness of 1 micron ($10^{-6}$m) was deposited on silicon wafer by spin coating, and then baked for 1 hour at 160° C. The wafer was then placed on the top of the copper anode plate. The cathode was silver and a 15 micron ($1.5 \times 10^{-5}$m) thick Mylar film mask was coated thereon by conventional spinning techniques. The mask was separated from the polymethylmethacrylate film by a gap having a thickness of $2 \times 10^{-5}$m. There was a sharp laser beam cut pattern in the Mylar film with 10 microns ($10^{-5}$m) line width. The cathode was pulsed with a few milli ampere transmitting current for about 5 seconds to yield well defined images having a resolution of $5 \times 10^{-6}$m of the pattern on the film of polymethylmethacrylate after development in 2-heptanone. The 5 second exposure is substantially faster than the several minute exposure needed in X-ray lithography.

EXAMPLE 2

In a proximity mask mode, shown in FIG. 2, a Mylar mask ($1.5 \times 10^{-5}$m thick) with a laser beam cut pattern with 15 micron line width was placed on the top of polymethylmethacrylate, which was spun on a silicon wafer and prebaked to a thickness of $10^{-6}$m. Spacers around the edge of the wafer form a gap having a thickness of $2 \times 10^{-5}$m between the polymethylmethacrylate and the mask. The cathode was pulsed with a few milli ampere transmitting current for about one minute to yield well defined images having a resolution of $5 \times 10^{-6}$m of the pattern in the film of polymethylmethacrylate after development in 2-heptanone for 1 minute. The line width obtained in this way is about five micron ($10^{-6}$), much narrower than the original pattern, probably because a static electrical field on the edge of the mask acted as a focus lens.

A Mylar mask film used in Example 1 and 2 can be replaced with Pyrex glass, and others. In an emitter mask mode, the mask can be made directly from polymethylmethacrylate deposited on metal substrate according to a conventional electron beam lithographic technique.

Although several preferred embodiments of this invention have been described, it is understood that numerous variations may be made in accordance with this invention.

I claim:

1. An electro-lithographic method adapted to form a pattern of high resolution in an electron sensitive resist material comprising the steps of:
    applying a layer of E-beam resist onto an anode,
    placing a platelike opaque cathode parallel to said anode and facing said layer of resist to form a first gap therebetween,
    placing a mask in said first gap between said cathode and said resist layer to form a second gap having a thickness of $10^{-4}$m to $10^{-5}$m between said mask and said resist layer, regulating the pressure to $10^{-3}$ to $10^{-7}$ torr between said electrodes by pump means to provide an environment suitable for the formation of secondary electrons, and applying a pulsed electric field of at least 2 KV to said cathode whereby secondary electrons from said cathode pass through the mask and are collimated to form a high resolution mask image in said resist layer.

2. A method as described in claim 1 whereby the mask is placed to form said second gap having a thickness of $5\times10^{-5}$m to $2\times10^{-5}$m.

3. A method as described in claim 1 whereby said mask is self sustaining and is placed on spacing means positioned on said resist layer to form said second gap between said resist layer and said mask and a third gap between said cathode and said mask.

4. A method as described in claim 1 whereby said mask is placed on said cathode.

5. A method as described in claim 1 whereby said E-beam resist is applied until the layer is between 1000 and 10,000 A° thick.

6. A method as described in claim 1 whereby the pressure is in the range of $10^{-3}$ to $10^{-5}$ Torr.

7. A method as described in claim 1 including the step of placing a substrate layer between the anode and E-beam resist layer.

8. A method as described in claim 1 including the step of applying a magnetic field perpendicular to the plane of said first gap.

* * * * *